United States Patent
Ikeda et al.

(10) Patent No.: US 6,946,929 B2
(45) Date of Patent: Sep. 20, 2005

(54) SURFACE ACOUSTIC WAVE DEVICE HAVING CONNECTION BETWEEN ELEMENTS MADE VIA A CONDUCTOR NOT ON THE PIEZOELECTRIC SUBSTRATE

(75) Inventors: Kazuo Ikeda, Osaka (JP); Masahiro Takada, Osaka (JP); Kazunori Nishimura, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/469,077

(22) PCT Filed: Feb. 10, 2003

(86) PCT No.: PCT/JP03/01365
§ 371 (c)(1),
(2), (4) Date: Aug. 26, 2003

(87) PCT Pub. No.: WO03/069778
PCT Pub. Date: Aug. 21, 2003

(65) Prior Publication Data
US 2004/0075513 A1 Apr. 22, 2004

(30) Foreign Application Priority Data
Feb. 12, 2002 (JP) ........................................ 2002-033665

(51) Int. Cl.[7] .................................................. H03H 9/64
(52) U.S. Cl. .................... 333/193; 333/195; 310/313 B
(58) Field of Search ................................ 333/193–196, 333/133; 310/313 D, 348, 313 B

(56) References Cited

U.S. PATENT DOCUMENTS 4,647,881 A * 3/1987 Mitsutsuka ................. 333/194
5,710,529 A * 1/1998 Sugiyama et al. .......... 333/193
6,034,578 A * 3/2000 Fujita et al. ................ 333/193
6,380,823 B1 * 4/2002 Ikata et al. ................. 333/133
6,388,545 B1 * 5/2002 Kawachi et al. ........... 333/193
6,466,103 B2 * 10/2002 Iwamoto et al. ........... 333/133
6,535,080 B2 * 3/2003 Taniguchi .................. 333/193
6,557,225 B2 * 5/2003 Takata et al. .............. 29/25.35
2003/0107454 A1 * 6/2003 Nakamura et al. ......... 333/133

FOREIGN PATENT DOCUMENTS

| JP | 5-167389 | 7/1993 |
| JP | 7-283684 | 10/1995 |
| JP | 2003-32070 | 1/2003 |

OTHER PUBLICATIONS

International Search Report corresponding to application No. PCT/JP03/01365 dated Apr. 1, 2003.
English translation of PCT/ISA/210, dated Apr. 1, 2003.

* cited by examiner

*Primary Examiner*—Barbara Summons
(74) *Attorney, Agent, or Firm*—RatnerPrestia

(57) ABSTRACT

A surface acoustic wave device comprises: a plurality of surface acoustic wave elements provided on a piezoelectric substrate to be electrically isolated with each other, a substrate provided with a first conductor electrically connecting the plurality of surface acoustic wave elements, a second conductor electrically isolated to the first conductor and an external terminal, and a sealing member for protecting the substrate and the piezoelectric substrate. For the substrate, a package having a recess or an insulating substrate is used. The first conductor is electrically isolated to the external terminal, while the second conductor is electrically connected with the external terminal. The above-described structure provides a small-sized surface acoustic wave device with excellent-attenuation characteristics.

27 Claims, 8 Drawing Sheets

SURFACE ACOUSTIC WAVE DEVICE HAVING CONNECTION BETWEEN ELEMENTS MADE VIA A CONDUCTOR NOT ON THE PIEZOELECTRIC SUBSTRATE

THIS APPLICATION IS A U.S. NATIONAL PHASE APPLICATION OF PCT INTERNATIONAL APPLICATION PCT/JP03/01365.

TECHNICAL FIELD

The present invention relates to a surface acoustic wave device for use in communication apparatus and the like.

BACKGROUND ART

Conventional surface acoustic wave device (hereinafter referred to as a device) having a plurality of pass band frequencies have been provided by forming several surface acoustic wave elements (hereinafter referred to as elements) corresponding to respective pass band frequencies on an individual piezoelectric substrate, then disposing the individual element in a package, and mounting a plurality of packages on a separate circuit board to connect the packages electrically.

In the above-configured device where the elements are packaged individually, interaction among the elements can be reduced. However, the device downsizing is difficult because of the plurality of packages.

Japanese Patent Laid-Open Publication No. H5-167389 discloses a method to solve the above problem. According to the method, a plurality of elements are housed in a package, and integrated. Thereby, the number of packages can be reduced and the device size can be made smaller. Another known method is to provide a plurality of elements 2 and 3 formed on a single piezoelectric substrate 1, as shown in FIG. 9. Output terminal electrode 4 and input terminal electrode 5 of the elements 2 and 3 are directly connected using connection electrode 6, and the elements are housed in a single package.

However, when a plurality of elements is housed in a single package, a certain specific space within the package for the elements is necessary. This limits further downsizing of a device. Moreover, when a plurality of elements is provided on a single piezoelectric substrate and electrically connected directly together, the plurality of elements affect each other to deteriorate attenuation characteristics.

DISCLOSURE OF INVENTION

A surface acoustic wave device of the present invention includes a plurality of surface acoustic wave elements, the elements are electrically isolated with each other, and are formed on a single piezoelectric substrate; a substrate provided with a first conductor which electrically connects the plurality of surface acoustic wave elements, a second conductor which is electrically isolated to the first conductor, and an external terminal; and a sealing member for protecting the substrate and the piezoelectric substrate. The substrate is formed of a package having a recess or an insulating substrate, the first conductor is electrically isolated to an external terminal, and the second conductor is electrically connected with the external terminal. The above-described structure in accordance with the present invention provides a small-sized surface acoustic wave device which exhibits excellent attenuation characteristics.

DESCRIPTION OF THE PREFERRED EMBODIMENTS

Exemplary embodiments in accordance with the present invention are described in the following with reference to FIG. 1–FIG. 8.

First Exemplary Embodiment

Figure 1:
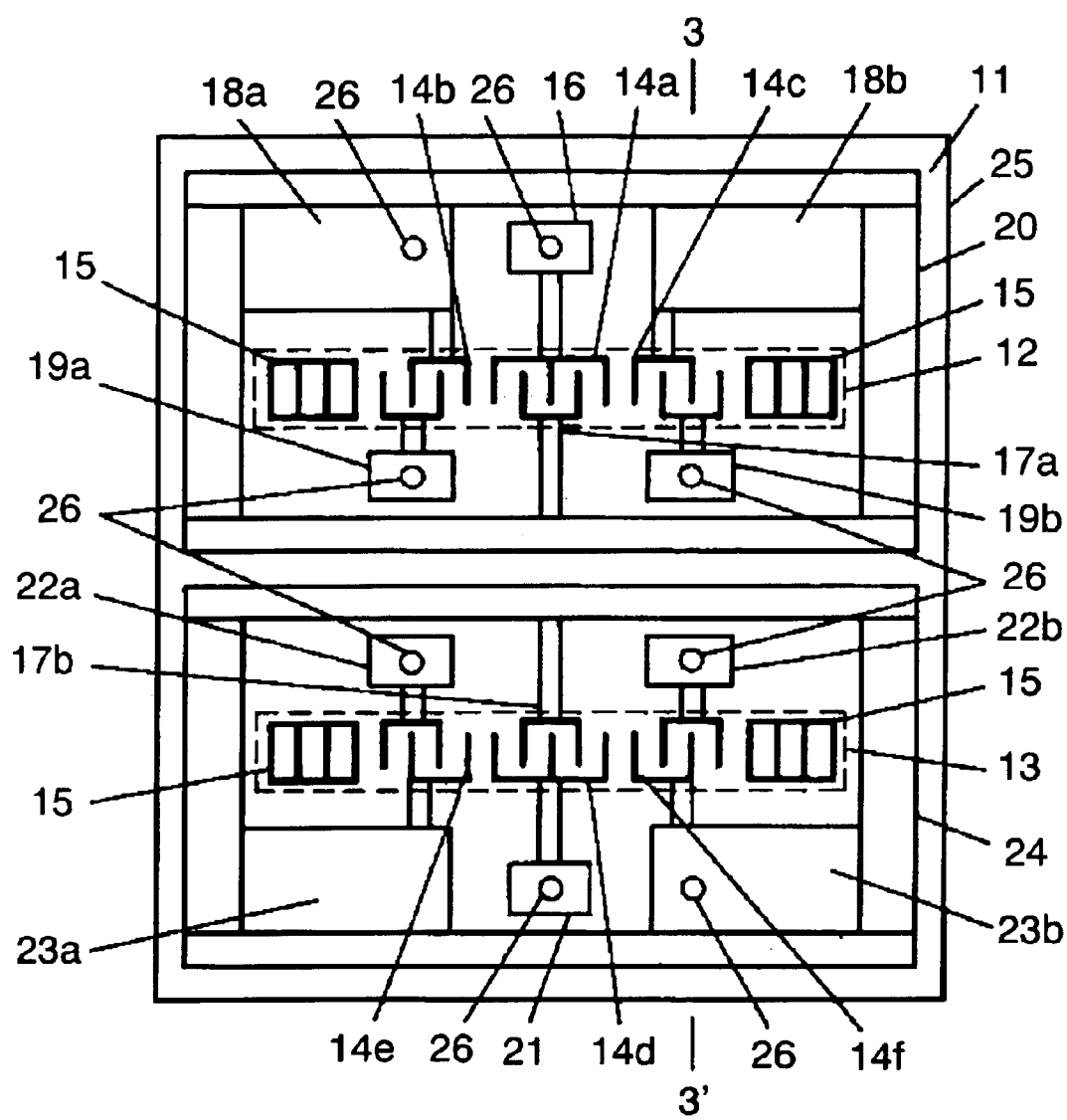
FIG. 1 is a plan view of an element in a first exemplary embodiment of the present invention.

FIG. 1 shows a plan view of an element in the first exemplary embodiment of the present invention.

Referring to FIG. 1, first element 12 and second element 13 comprising longitudinal coupling type double mode surface acoustic wave filter (DMS) and the like are provided on a piezoelectric substrate 11 made of materials such as $LiTaO_3$. The first element 12 includes an electrode group comprising three sets of comb electrodes, first comb electrode 14a, second comb electrode 14b and third comb electrode 14c, and two reflector electrodes 15 are disposed at both sides of the three sets of electrodes. In the same manner, second element 13 includes electrode group comprising three sets of comb electrode, first comb electrode 14d, second comb electrode 14e and third comb electrode 14f, and two reflector electrodes 15 are disposed at both sides of the three sets of electrodes.

One side of the central comb electrode 14a in the first element 12 is connected with first input terminal electrode 16 provided at an outer portion of the piezoelectric substrate 11. Another side of the comb electrode 14a is connected with first connection electrode 17a provided opposite to the input terminal electrode 16.

One side of comb electrode 14b and one side of comb electrode 14c are connected with first ground electrode 18a and second ground electrode 18b, respectively, and both of the ground electrodes are provided on the same side as the input terminal electrode 16. Another side of the comb electrode 14b and the comb electrode 14c are connected with first output terminal electrode 19a and second output terminal electrode 19b, respectively, the two terminal electrodes are provided on a side opposite to the ground electrode 18a and the ground electrode 18b.

Connection electrode 17a, ground electrode 18a and ground electrode 18b are electrically connected by means of frame-shaped first auxiliary electrode 20 surrounding the first surface acoustic wave element 12. Auxiliary electrode 20 is structured by a combination of electrodes, and respective electrodes comprising the auxiliary electrode 20 have different width depending on the portions and are electrically connected.

Likewise, one side of the comb electrode 14d in the second element 13 is connected with second connection electrode 17b provided at the first element 12 side, while another side of the comb electrode 14d is connected with third output terminal electrode 21 provided opposite to the connection electrode 17b.

One side of the comb electrode 14e and the comb electrode 14f are connected with second input terminal electrode 22a and third input terminal electrode 22b, respectively, and the second input terminal electrode 22a and the third input terminal electrode 22b are provided at the first element 12 side. Another side of the comb electrode 14e and another side of the comb electrode 14f are connected with third ground electrode 23a and fourth ground electrode 23b, respectively.

The connection electrode 17b, the ground electrode 23a and the ground electrode 23b are electrically connected by means of second auxiliary electrode 24, or a combination of electrodes, surrounding the second element 13.

As described above, two elements 12 and 13 are provided on a single piezoelectric substrate 11 so that the elements are electrically isolated to each other, and the elements are surrounded with the auxiliary electrode 20 and the auxiliary electrode 24, respectively, to form third element 25. On the piezoelectric substrate 11, the auxiliary electrode 20 and the auxiliary electrode 24 are disposed to be electrically isolated to each other.

The input terminal electrode 16, the ground electrode 18a, the output terminal electrode 19a, the output terminal electrode 19b, the output terminal electrode 21, the input terminal electrode 22a and the input terminal electrode 22b are provided with bump 26 made of Au or the like material for electrical connections of the third element 25 with external apparatus.

Figure 2:
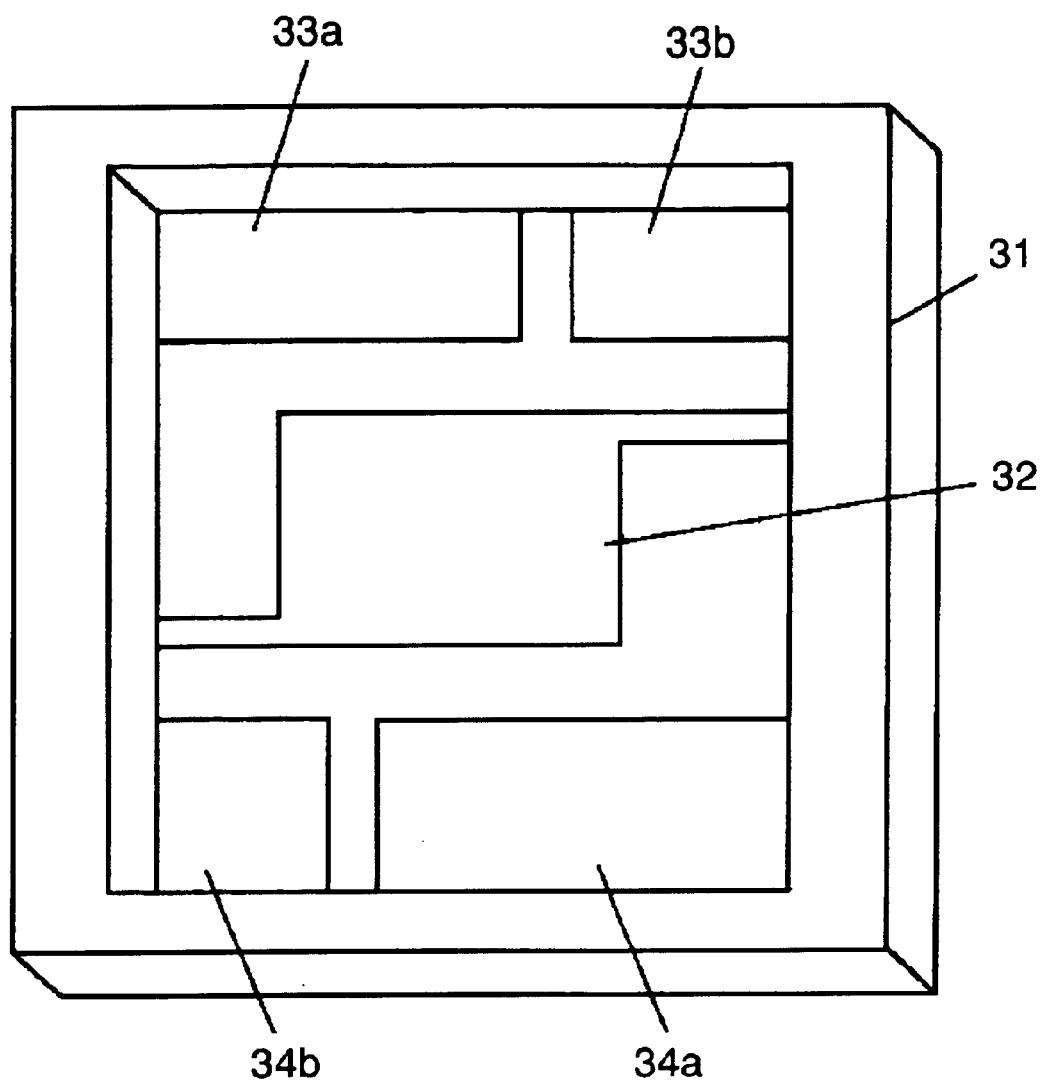
FIG. 2 is a perspective view of a package in the first exemplary embodiment.

FIG. 2 shows a perspective view of a package for mounting the element shown in FIG. 1.

Package 31 in FIG. 2 is made of a BaO—Al$_2$O$_3$—SiO$_2$ based ceramic material, for example, and has a recess in a central portion. The package is provided on a bottom surface of the recess with conductor pattern 32 in an area which opposes to the output terminal electrode 19a, the output terminal electrode 19b, the input terminal electrode 22a and the input terminal electrode 22b when the third element 25 is face down mounted. The conductor pattern 32 is formed in a continuous flat shape, made of Ag or the like metal, for example, and is disposed at a central portion of the recess. The shape of the conductor pattern 32 is point-symmetrical, and has a shape with a large central portion and relatively small portions making contact with inner wall surfaces (side faces) of the recess. A size of the central portion is shaped in a manner that a length is shorter than that of a long side of the substrate 11, while a length in a direction of the short side of the substrate 11 is almost the same.

The package is also provided with conductor pattern 33a in a place opposing to the input terminal electrode 16, conductor pattern 33b opposing to the ground electrode 18a, conductor pattern 34a opposing to the output terminal electrode 21, and conductor pattern 34b opposing to the fourth ground electrode 23b.

Namely, the conductor pattern 32 is electrically connected only with the input and output terminals of the elements 12 and 13, and is electrically isolated to external terminal 35 (not shown) disposed at a reverse surface of the package.

The conductor pattern 33a and the conductor pattern 34a are connected with input and output terminals (hereinafter referred to as "hot terminals") of the element 25, while conductor patterns 33b and 34b are connected with the ground terminal (not shown) of the package 31. Thus, the input and output terminals of the element 25 are connected with external terminals 35 of the package 31, thus, electrical characteristics of the element 25 can be lead out from the package 31 via the external terminals.

In the configuration as shown in FIG. 1, arrangement in a relative positioning of the ground electrode 18a, the ground electrode 18b, the ground electrode 23a and the ground electrode 23b, and the hot terminals i.e. the input terminal electrode 16, the output terminal electrode 19a, the output terminal electrode 19b, the output terminal electrode 21, the input terminal electrode 22a and the input terminal electrode 22b of the element 25 may be reversed to obtain a surface acoustic wave element of the same function.

The conductor pattern 32 is shaped large in the central portion for providing electrical connection with the output terminal electrode 19a, the output terminal electrode 19b, the input terminal electrode 22a and the input terminal electrode 22b, while the outer portions are shaped small. This shape is effective to suppress propagation of unwanted waves and to reduce interference between the element 12 and the element 13 after they are coupled together. In order to electrically connect the output terminal electrode 19a, the output terminal electrode 19b, the input terminal electrode 22a and the input terminal electrode 22b at low impedance with each other, a wide conductor pattern is preferred. For the purpose of good electrical balance, it is preferred that the conductor pattern 32 is designed in a symmetrical shape such as a point-symmetrical shape or a line-symmetrical shape. The size of the conductor pattern 32 that is smaller than the length of the substrate 11 contributes to suppress the propagation of unwanted waves and reduce the interference between the element 12 and the element 13 after they are coupled together. By providing the conductor pattern 32 continuously contacting with two inner walls (side faces) of the recess of the package 31 in two directions, the metal layer of the conductor pattern 32 can be formed easily and efficiently. Providing conductor pattern 32 at the central part of package 31 for electrical connection between the element 12 and the element 13 contributes to better electrical balance and loss reduction.

As to the conductor patterns 33a, 33b, 34a and 34b, it is also preferred to use the shapes as wide as possible for reducing the impedance. Also for the purpose of good electrical balance, it is preferred that the patterns are formed in symmetrical shape and disposed in symmetrical arrangement with respect to package 31.

Figure 3:
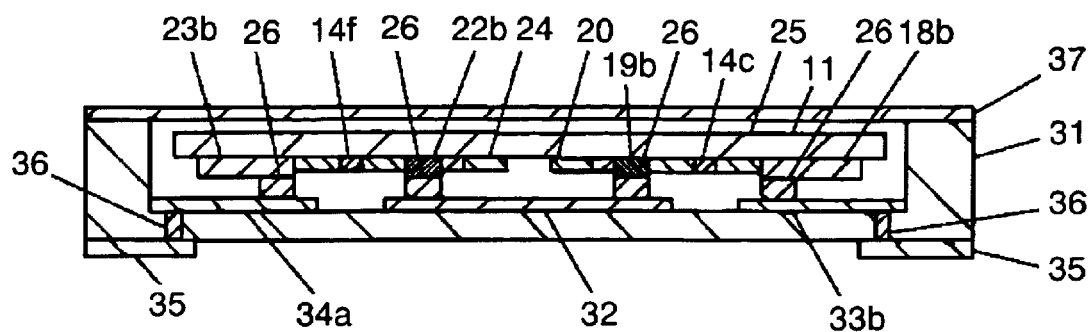
FIG. 3 is a cross sectional view of a device containing the element of the first exemplary embodiment sectioned along a line 3—3 of FIG. 1, wherein the element is mounted in a package.

FIG. 3 shows a cross sectional view of a device sectioned along the line 3—3', wherein the third surface acoustic wave element 25 shown in FIG. 1 is mounted in the package 31.

In FIG. 3, the element 25 is mounted in the recess of the package 31 with a functional surface containing the comb electrodes and the like downward. Practical process of mounting is described below. First, the element 25 is placed in the recess of the package 31. Then, the element 25 is mounted on the package 31 by heat-pressing using ultrasonic vibration and the like, after aligning positions of the bumps 26 of the input terminal electrode 16, the ground electrode 18a, the output terminal electrode 19a, the output terminal electrode 19b, the output terminal electrode 21, the input terminal electrode 22a, the input terminal electrode 22b and the ground electrode 23b to oppose to the conductor pattern 32, the conductor patterns 33a, 33b, 34a and 34b provided in the package 31.

The third comb electrode 14c of the first element 12 is electrically connected with the conductor pattern 32 via the output terminal electrode 19b and the bump 26, then, it is further connected via the bump 26 and the input terminal electrode 22b with the sixth comb electrode 14f of the second element 13. Namely, the comb electrode 14c and the comb electrode 14f and the comb electrode 14b and the comb electrode 14e, which had been electrically isolated on the piezoelectric substrate 11, are now electrically coupled via the conductor pattern 32 of the package 31.

The package 31 is provided with the external terminals 35, which are electrically connected with the conductor patterns 33b, 34a via connection electrodes 36 made of Ag or the like metal filled in through holes of the package 31. The hot terminals of the element 25 are thus connected with the external terminal 35 of the package 31, and the electrical characteristics of the element 25 can be lead out from the package.

The connection electrode 36 may be formed in the package 31 to a half-way to the back surface of the package 31, and then stretched to the outside of the package 31 to be connected with the external terminal 35. Or, a metal layer (not shown) for use as a shield electrode, for example, may be formed in the package 31 with Ag or the like metal, and the metal layer may be used for connecting the third connection electrode 36 and the external terminal 35.

Package 31 in the present embodiment is provided at an upper surface of the side-wall with bonding member 37 made of Ag or the like material. The package is sealed with a metal lid (not shown) made of Al or the like material placed above the recess by heat-pressing.

Conductor patterns 32, 33a, 33b, 34a and 34b, and bonding member 37 may be made of materials such as Ag, W, Cu and Au. Impedance of the connection portion can be reduced by making a thickness of the conductor pattern 32 thicker or the pattern width wider. This improves isolation among the plurality of elements after they are connected together electrically.

Depending on the needs, surfaces of these conductor patterns and bonding member 37 may be plated with Au and the like material to prevent oxidation and alloying, or to improve bonding property. To further prevent the alloying, an under layer metal such as Ni may be plated prior to the Au plating. The lid may be brazed using an Ag-Sn solder or the like material provided on the bonding member 37, when it is necessary. The conductor pattern 32 can be easily plated, when it is formed continuously from one side to another side of the inner bottom surface of the recess of the package 31.

According to the above-described structure of the present invention, although the two elements 12 and 13 are provided on the same piezoelectric substrate 11, the influence due to interference can be suppressed, because there is no direct electrical contact between the elements on piezoelectric substrate 11, and they are connected by the bumps via conductor pattern 32. Furthermore, in accordance with the present invention, the device size can be made smaller by forming a plurality of elements on the same piezoelectric substrate simultaneously. And the face-down mounting of the elements using the bumps provide stable electrical characteristics with a simple structure.

Figure 5:
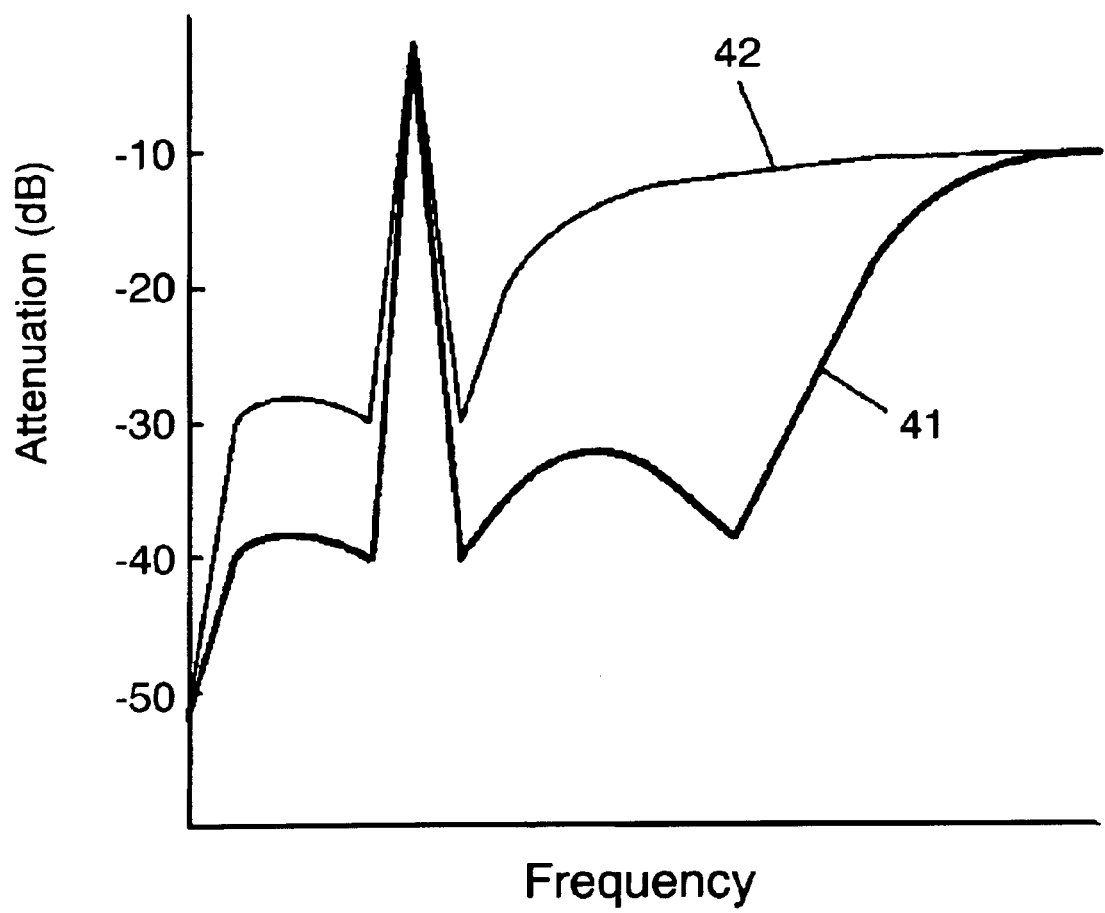
FIG. 5 shows filter characteristics chart of the elements in the first exemplary embodiment.

FIG. 5 compares a surface acoustic wave device in the present embodiment 1 with a conventional device with respect to the filter characteristic.

In FIG. 5, curve 41 represents filter characteristic in the present embodiment 1, while curve 42 that of the conventional surface acoustic wave device.

Figure 9:
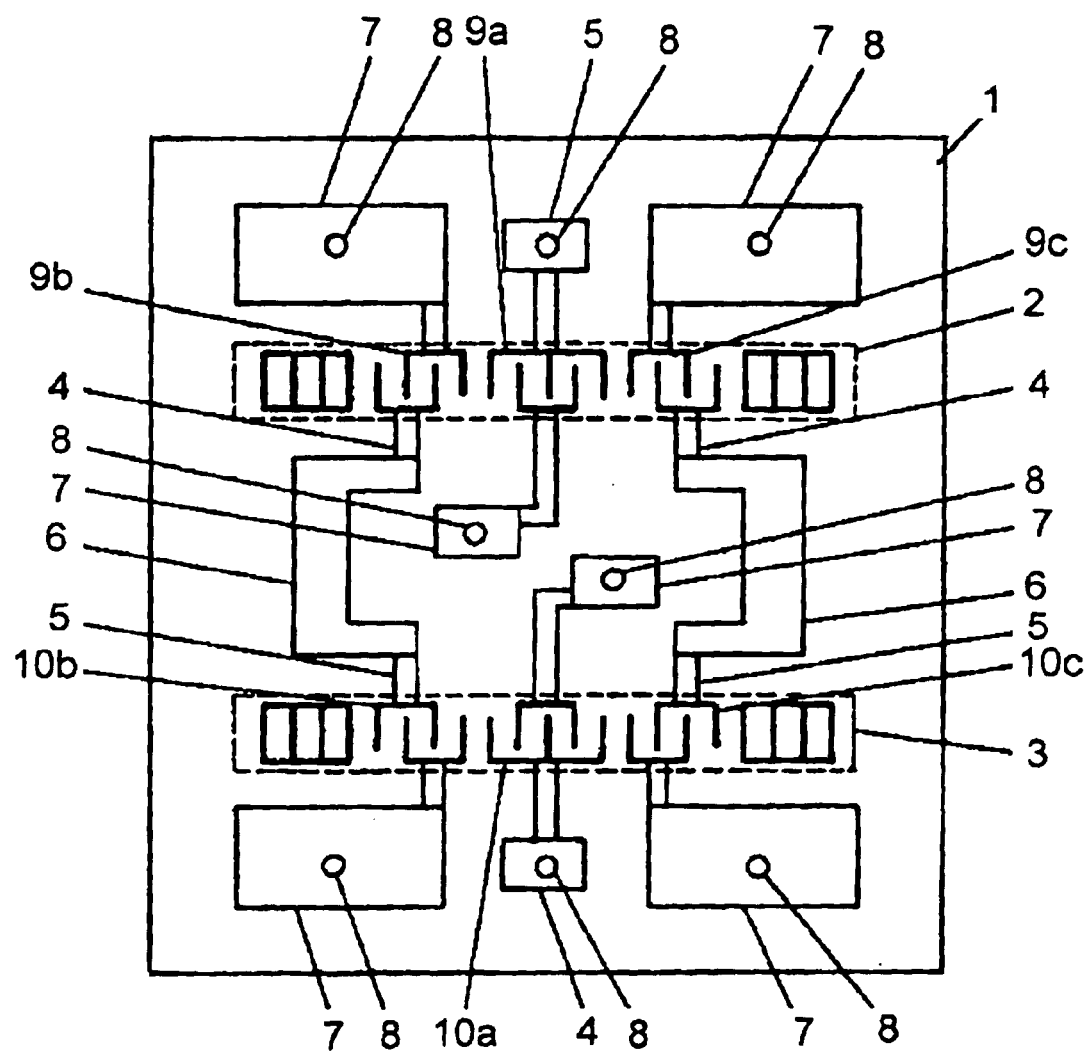
FIG. 9 is a plan view of a conventional surface acoustic wave element.

The conventional surface acoustic wave device is structured as shown in FIG. 9, wherein the two elements 2 and 3 are formed on the same piezoelectric substrate 1 and the output terminal electrode 4 of the element 2 is directly connected with the input terminal electrode 5 of the element 3 via the connection electrode 6 on the same piezoelectric substrate 1.

As shown in FIG. 5, the device in the present embodiment shows superior attenuation characteristic as compared with the conventional device in the frequencies outside a pass band range. Namely, in the frequency range lower than the pass band the attenuation improves by 10 dB at the maximum, at the same time in the frequency range higher than the pass band it improves by 10–30 dB at the maximum.

As described above, the interaction can be reduced and the isolation can be improved, by forming the two elements 12 and 13 on the same piezoelectric substrate 11 in the electrically isolated state, and then face-down mounting them on the package 31 using bump to make the elements electrically coupled via the conductor pattern 32 of package 31 to suppress propagation of unwanted waves of the two elements 12 and 13 on the piezoelectric substrate. In this way, the filter characteristic, especially the attenuation outside the pass band, can be improved remarkably.

In the conventional technology, it has been difficult to increase the attenuation in the frequency range higher than the pass band, when DMS is used for the electrode of a surface acoustic wave element. In the structure in accordance with the present embodiment, however, the attenuation outside the pass band can be remarkably improved, especially in the higher frequency side.

The number of the comb electrodes in an element can be any number, and the number of surface acoustic wave elements provided on the same piezoelectric substrate can be 2 or any number more than 2. Although longitudinal coupling type DMS is used for the electrodes of element in the present embodiment, other electrode structures such as transversal type, ladder type, resonator and the like may be used instead.

The location and the numbers of the bump 26 may be changed as required.

Although the bump 26 has been used as a means for electrical connection between the element 25 and the conductor pattern of the package 31, other means such as various kinds of conductive adhesives, and a combination of bump and conductive adhesive may be used.

The use of conductive adhesive reduces mechanical stress at a time of the electrical connection, as compared to the connection using the bumps. This leads to an increased reliability of the connected portion. The use of both the conductive adhesive and the bump provides a lowered connection impedance, as well as decreased mechanical stress at the connected point. This contributes to improve the attenuation outside the pass band range.

By surrounding the element with the frame-shaped auxiliary electrode formed of electrodes electrically connected to each other, electric charges generated on the piezoelectric substrate 11 can be evenly distributed on the substrate. Thereby, possible damage of the element by an electrostatic discharge, for example, can be prevented.

The auxiliary electrode may have an even width for the entire structure, or the width may vary depending on portions.

Although the first and second elements 12, 13 have been face-down mounted in the recessed package 31 and sealed with the lid in the present embodiment, the method of mounting is not limited to the above-described method.

Figure 4:
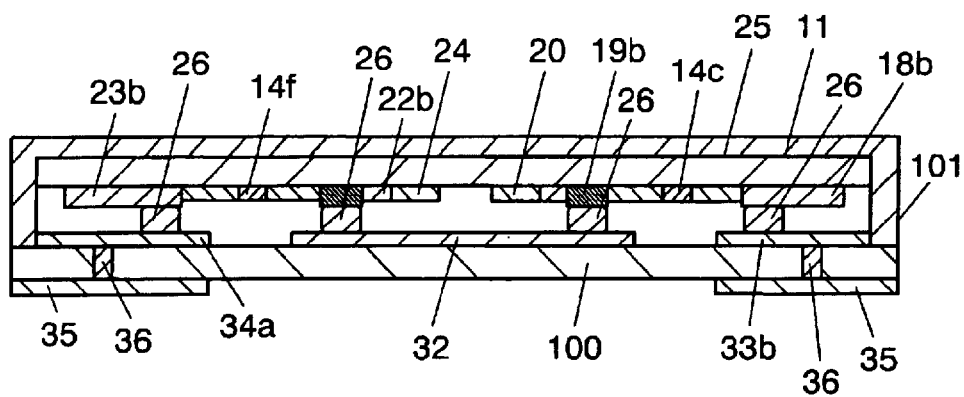
FIG. 4 is a cross sectional view of another example of the device in the first exemplary embodiment.

For example, flat substrate 100 may be used instead of the recessed package 31, as shown in FIG. 4. After the element 25 comprising the elements 12 and 13 is face-down mounted on board 100, they may be sealed with sealing member 101. The substrate 100 may be optionally selected from the group consisting of ceramics, resins, metals and the like materials. Sealing member 101 may also be optionally selected from resins, metals, ceramics and the like materials. In the above arrangements, a CSP (Chip-Size Package) can be obtained, where the element size and the package size are substantially the same.

A small-sized device having excellent filter characteristics, specifically in terms of the attenuation outside the pass band range, can be obtained by employing the CSP structure.

As described above, according to the present invention, mutual influence between the two surface acoustic wave elements can be reduced and the isolation can be enhanced to each other, by providing two elements that are electrically isolated to each other on the same piezoelectric substrate 11, and electrically connecting the two elements via conductor pattern disposed on the package. In this way, the filter characteristics, specifically in terms of the attenuation outside the pass band range, are improved remarkably, and the outer dimensions of the device can be made smaller.

Second Exemplary Embodiment

Figure 6:
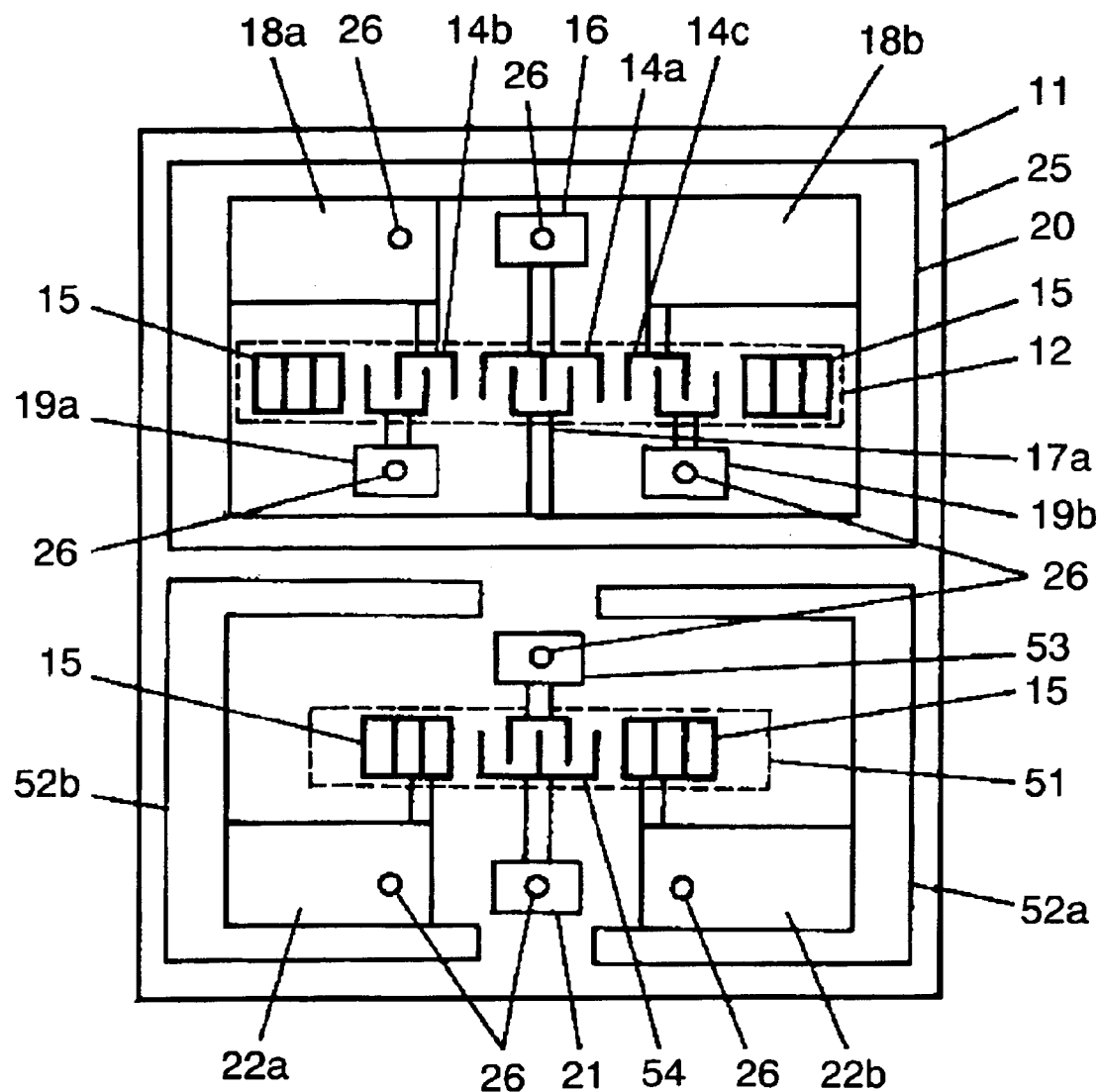
FIG. 6 is a plan view of an element in a second exemplary embodiment of the present invention.

A second exemplary embodiment of the present invention is described below referring to FIG. 6. FIG. 6 is a plan view showing the structure of electrode pattern of a surface acoustic wave device in accordance with the second embodiment. Those portions identical to those of the first embodiment are represented by using the same numerals, and detailed descriptions of which portions are eliminated.

The point of difference from the first embodiment lies in the electrode structure, that is, the electrode structure of the two elements, first element 12 and fourth element 51, disposed on the same piezoelectric substrate is different to each other. Namely, the element 12 is surrounded with a frame-shaped first auxiliary electrode 20, which is formed of electrically-connected electrodes, while the element 51 employs third auxiliary electrode 52a and fourth auxiliary electrode 52b, and these auxiliary electrodes are electrically independent to each other.

Namely, a device in the present embodiment includes the first element 12 containing one DMS comprising three comb electrodes 14a, 14b and 14c, and a set of resonator comprising the fourth element 51 having a single fourth comb electrode 54. Both of the elements are formed on the same piezoelectric substrate 11 and are electrically isolated to each other. The element 12 is surrounded at the portion about the DMS with a frame-shaped auxiliary electrode 20, which is formed of electrodes electrically connected to each other and the width of the auxiliary electrode 20 differs depending on the portions. The element 51 is surrounded at a portion about the resonator with auxiliary electrode 52a and auxiliary electrode 52b. The electrodes 52a and 52b have different widths depending on the portions, and are electrically independent to each other. The element 12 and the element 51 are electrically coupled together via conductor pattern 32 of the package 31, in the same manner as in the first embodiment, to complete a finished surface acoustic wave device.

As FIG. 6 shows, the element 12 and the element 51, each having different electrode structure, are used in the present embodiment, and respective elements 12 and 15 are surrounded with auxiliary electrode 20 and auxiliary electrodes 52a, 52b having different shapes. In addition to the effect of the above configuration, as the element 12 and the element 51 are disposed to be electrically isolated to each other on the piezoelectric substrate 11, mutual influence between the two elements is reduced, and isolation is improved. As a result, the filter characteristics, specifically the attenuation outside the pass band range can be improved remarkably. Thus a device that exhibits a significant attenuation in high frequency range can be obtained. Furthermore, auxiliary electrodes 52a, 52b in the present embodiment can be designed to be electrically isolated to each other, as shown in FIG. 6. Therefore, more designing freedom is obtained in designing the electrode pattern. Thus, various types of electrode structure can be employed.

Moreover, the use of elements having different electrode structures facilitates to obtain specific frequency characteristics as required such as, for example, a characteristic of high attenuation in a narrow frequency range. Thus more designing freedom is obtained.

Although the element 12 and the element 51 employ the auxiliary electrode 20 and the auxiliary electrodes 52a, 52b in different shapes, respectively, these elements may use auxiliary electrodes of the same design, for example, like the first auxiliary electrode 20.

Although the DMS is disposed at the input side while the resonator at the output side in the present embodiment, the positioning of DMS and resonator may be reversed. The types of the electrode structure is not limited to the two types, instead, a plurality of combinations comprising more than two electrode structure types may be used.

The auxiliary electrodes may have either the same width entirely, or the width may vary depending on the portions.

As described above, according to the present embodiment, designing freedom to obtain a desired frequency characteristic is further enhanced in comparison with the first embodiment. And a surface acoustic wave devices having excellent filter characteristics, specifically in terms of the attenuation outside the pass band range is easily produced.

Third Exemplary Embodiment

A third exemplary embodiment of the present invention is described below referring to FIG. 7.

Figure 7:
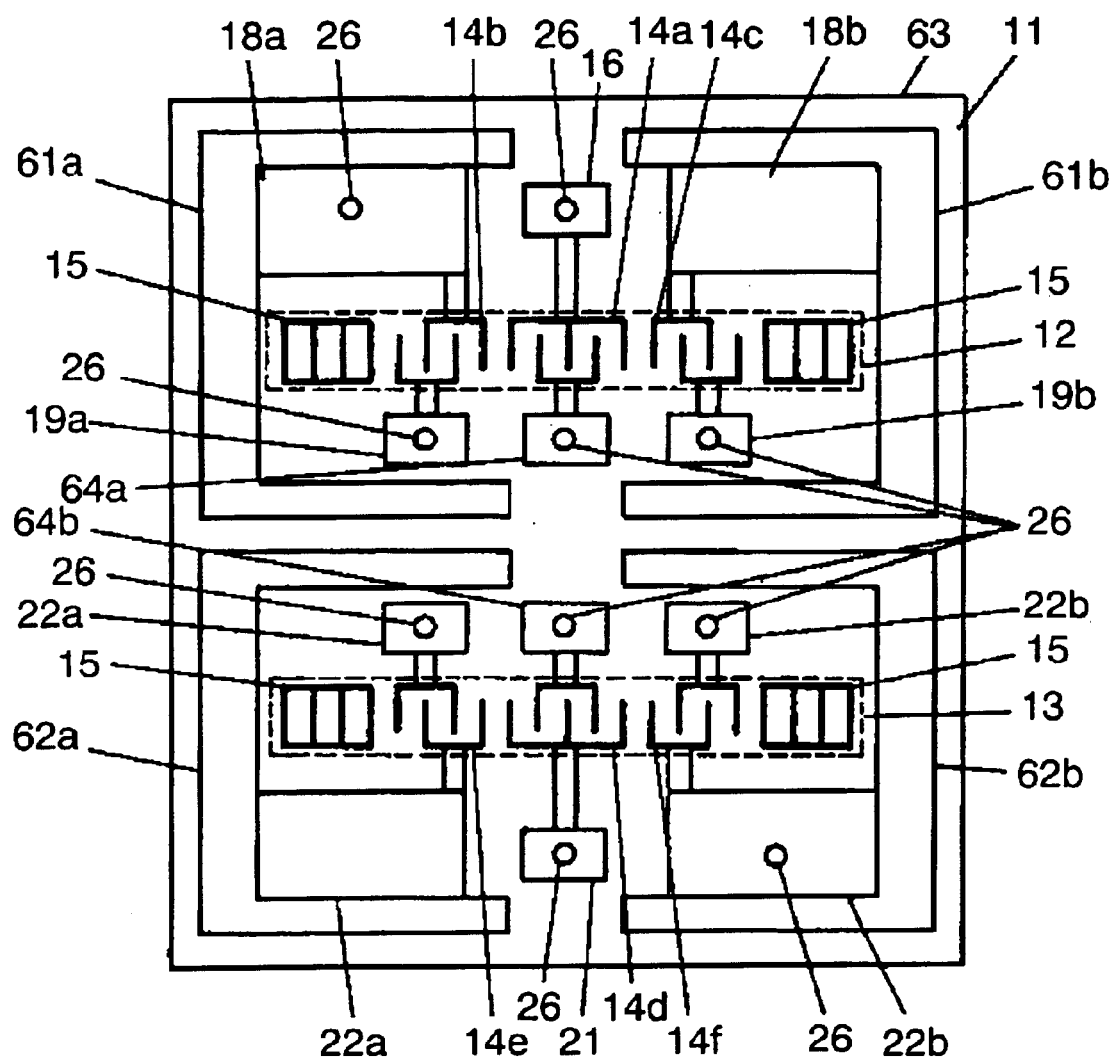
FIG. 7 is a plan view of an element in a third exemplary embodiment of the present invention.

FIG. 7 is plan view showing the structure of electrode pattern in a surface acoustic wave device in accordance with the third exemplary embodiment. Those portions identical to the elements of the first exemplary embodiment are represented by using the same numerals and detailed descriptions of which portions are eliminated.

The point of difference from the first exemplary embodiment is that two elements 12 and 13 provided on the same piezoelectric substrate 11 have the same electrode structure, and the element 12 and the element 13 are surrounded, respectively, by electrically-independent auxiliary electrodes, i.e. fifth auxiliary electrode 61a connected with the first ground electrode 18a and sixth auxiliary electrode 61b connected with the second ground electrode 18b, and seventh auxiliary electrode 62a connected with the second input terminal electrode 22a and eighth auxiliary electrode 62b connected with the third input terminal electrode 22b.

Namely, in a device in the present embodiment, the first element 12 and the second element 13, both having the same electrode structure, are provided on the same piezoelectric substrate 11 to be electrically isolated to each other, and respective element 12 and element 13 are surrounded at the portions about the elements with a plurality of electrically-independent auxiliary electrodes, the width of the auxiliary electrodes is different depending on the portions. The elements are electrically coupled in the same way as in the first embodiment via the conductor pattern 32 of the package 31, to complete a finished surface acoustic wave device.

Referring to FIG. 7, the device uses the first element 12 and the second element 13, both having the same electrode structure, and each of the auxiliary electrodes 61a, 61b, 62a, 62b surrounding the respective elements 12 and 13 has the same shape. Since the first element 12 and the second element 13 are disposed to be electrically isolated to each other on the same piezoelectric substrate 11, the mutual influence between the two elements 12 and 13 on piezoelectric substrate 11 is reduced, and the isolation is enhanced. Therefore, the filter characteristics, specifically with respect to the attenuation outside the pass band range, can be significantly improved.

Furthermore, use of the same-shaped four auxiliary electrodes 61a, 61b, 62a, 62b contributes to make entire fifth element 63, which is consisting of the elements 12 and 13, more symmetric. As a result, electric charges generated by a mechanical strain or heat applied on the piezoelectric substrate 11 are made even, and a deviation of electric charges on the entire element 63 is decreased. Thus, possible damage of the surface acoustic wave element due to an electrostatic discharge, for example, can be reduced.

The element 12 is surrounded with a pair of auxiliary electrodes 61a and 61b, likewise, the element 13 is surrounded with a pair of auxiliary electrodes 62a and 62b. The auxiliary electrodes 61a, 61b, 62a and 62b are formed electrically isolated among each other on the same piezoelectric substrate 11, and the auxiliary electrodes are connected with conductor patterns 33a, 33b, 34a and 34b of the package by means of bump 26 and/or conductive adhesive. The width of the auxiliary electrodes 61a, 61b, 62a and 62b may be the same anywhere, or the width may be different depending on the portions.

Figure 8:
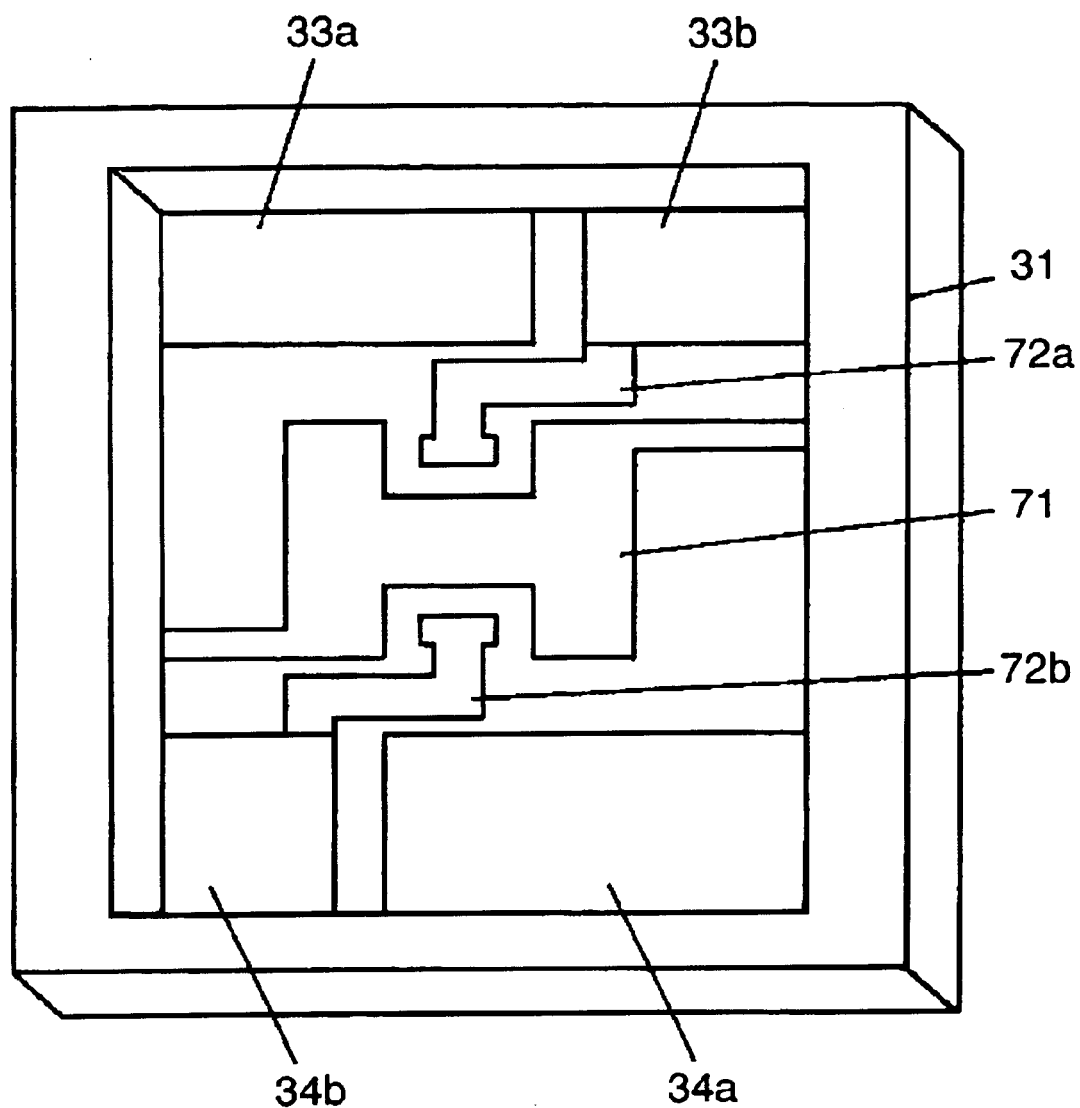
FIG. 8 is a perspective view of a package in the third exemplary embodiment.

FIG. 8 is a perspective view showing an example of a package in accordance with the present embodiment. Referring to FIG. 8, conductor pattern 71 of the package 31 makes no electrical contact with fifth ground electrode 64a and sixth ground electrode 64b of the element 63, but it is connected with the first output terminal electrode 19a, the second output terminal electrode 19b, the second input terminal electrode 22a and the third input terminal electrode 22b.

On the package 31, seventh ground electrode 72a, which is connected to the conductor pattern 33b, is provided at a location opposing to the ground electrode 64a of element 63, and eighth ground electrode 72b, which is connected to the second conductor pattern 34b, at a location opposing to the ground electrode 64b.

Although, in the present embodiment, the first element 12 and the second element 13 are provided with the same electrode structure, other surface acoustic wave elements having different electrode structures may be used whenever necessary. Number of types of the electrode structures used in the surface acoustic wave element is not limited to two, instead, a plurality of the combinations of more than two types of electrode structure may be used at the same time.

Comparing with the first exemplary embodiment, the fifth element 63 as a whole is made more symmetric, where the device in accordance with the present embodiment has, as described above, the first element 12 and the second element 13 disposed on the same piezoelectric substrate 11 to be electrically isolated to each other, and the respective elements 12 and 13 are surrounded at the portions about the elements with a plurality of electrically-independent auxiliary electrodes 61a, 61b, 62a and 62b. Consequently, the structure not only improves the attenuation outside the pass band range, but also provides easier production of a surface acoustic wave devices that has excellent characteristics and hardly suffers damage of the element due to the electrostatic discharge.

Although the elements in the above exemplary embodiments are explained to provide a device by combining two elements, more varieties of characteristics of a device can be obtained through a combination of a plurality of elements according to specific application targets.

INDUSTRIAL APPLICABILITY

A small-sized surface acoustic wave devices having excellent attenuation property can be produced easily in accordance with the present invention, by providing a plurality of surface acoustic wave elements on the same piezoelectric substrate to be electrically isolated with each other, and electrically connecting the plurality of elements together via a conductor pattern provided on a package.

What is claimed is:

1. A surface acoustic wave device comprising:
a plurality of surface acoustic wave elements provided on a piezoelectric substrate, wherein electrical connection on said piezoelectric substrate between said plurality of surface acoustic wave elements is prevented, and;
a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors,
wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors.

2. The surface acoustic wave device of claim 1, wherein said substrate is one of a package having a recess and an insulating substrate.

3. The surface acoustic wave device of claim 1, wherein said first conductor is electrically isolated from said external terminal.

4. The surface acoustic wave device of claim 1, wherein said first conductor is disposed at a central portion of said substrate and has a symmetrical shape.

5. The surface acoustic wave device of claim 1, wherein said first conductor comprises a central portion and portions smaller than said central portion, said smaller portions being formed to be symmetrical to said central portion, dimensions of said central portion being not larger than dimensions of said piezoelectric substrate.

6. The surface acoustic wave device of claim 1, wherein at least parts of said first conductor contact with said substrate at two side faces in two directions.

7. The surface acoustic wave device of claim 1, wherein portions about comb electrodes and reflector electrodes comprising said plurality of surface acoustic wave elements are surrounded with frame-shaped auxiliary electrodes, each of electrodes comprising said frame-shaped auxiliary electrodes being electrically connected.

8. The surface acoustic wave device of claim 1, wherein said substrate includes an inner conductor for electrically connecting at least one of said second conductors and said external terminal.

9. The surface acoustic wave device of claim 1, wherein said first conductor and said plurality of second conductors are disposed at respective locations opposing to input/output terminal electrodes of said plurality of surface acoustic wave elements.

10. The surface acoustic wave device of claim 1, wherein said plurality of surface acoustic wave elements includes a surface acoustic wave element having different electrode structures than another element.

11. The surface acoustic wave device of claim 1, wherein said plurality of surface acoustic wave elements includes at least an electrode structure of a double mode surface acoustic wave filter.

12. The surface acoustic wave device of claim 1, wherein said plurality of surface acoustic wave elements Includes at least an electrode structure of a longitudinal coupling type double mode surface acoustic wave filter.

13. A surface acoustic wave device comprising:
a plurality of surface acoustic wave elements provided on a piezoelectric substrate, wherein electrical connection on said piezoelectric substrate between said plurality of surface acoustic wave elements is prevented, and;
a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors,
wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors, and
wherein portions about comb electrodes and reflector electrodes comprising said plurality of surface acoustic wave elements are surrounded with frame-shaped auxiliary electrodes, each of electrodes comprising said frame-shaped auxiliary electrodes being electrically connected.

14. The surface acoustic wave device of claim 13, wherein at least one of said auxiliary electrodes is surrounding one surface acoustic wave element.

15. The surface acoustic wave device of claim 13, wherein a plurality of surface acoustic wave elements and a plurality of sets of auxiliary electrodes are provided on a single piezoelectric substrate.

16. The surface acoustic wave device of claim 15, wherein said plurality of sets of auxiliary electrodes are electrically isolated from each other on the single piezoelectric substrate.

17. The surface acoustic wave device of claim 15, wherein said plurality of sets of auxiliary electrodes are electrically connected with at least one of said second conductors.

18. A surface acoustic wave device comprising:
a plurality of surface acoustic wave elements provided on a piezoelectric substrate, wherein electrical connection on said piezoelectric substrate between said plurality of surface acoustic wave elements is prevented, and;
a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors,
wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors, and
wherein portions of said piezoelectric substrate about comb electrodes and reflector electrodes comprising said plurality of surface acoustic wave elements are provided with auxiliary electrodes electrically independent from each other on said plezoelectric substrate.

19. The surface acoustic wave device of claim 18, wherein at least one set of auxiliary electrodes comprised of said auxiliary electrodes is surrounding one surface acoustic wave element.

20. The surface acoustic wave device of claim 18, wherein a plurality of surface acoustic wave elements and a plurality of sets of auxiliary electrodes are provided on a single piezoelectric substrate.

21. The surface acoustic wave device of claim 20, wherein said plurality of sets of auxiliary electrodes are electrically isolated from each other on the single piezoelectric substrate.

22. The surface acoustic wave device of claim 20, wherein said plurality of sets of auxiliary electrodes are electrically connected with at least one of said second conductors.

23. A surface acoustic wave device comprising:
a plurality of surface acoustic wave elements provided on a piezoelectric substrate, wherein electrical connection on said piezoelectric substrate between said plurality of surface acoustic wave elements is prevented, and;
a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors,
wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors, and
wherein said first conductor is disposed at a central portion of said substrate and has a symmetrical shape.

24. A surface acoustic wave device comprising:
a plurality of surface acoustic wave elements provided on a piezoelectric substrate, wherein electrical connection on said piezoelectric substrate between said plurality of surface acoustic wave elements is prevented, and;
a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors,
wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors, and wherein said first conductor comprises a central portion and portions smaller than said central portion, said smaller portions being formed to be symmetrical to said central portion, dimensions of said central portion being not larger than dimensions of said piezoelectric substrate.

25. A surface acoustic wave device comprising:

a plurality of surface acoustic wave elements provided on a piezoelectric substrate, wherein electrical connection on said piezoelectric substrate between said plurality of surface acoustic wave elements is prevented, and;

a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors, wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors, and wherein at least parts of said first conductor contact with said substrate at two side faces in two directions.

26. A surface acoustic wave device comprising:

a plurality of surface acoustic wave elements provided on a piezoelectric substrate, wherein electrical connection on said piezoelectric substrate between said plurality of surface acoustic wave elements is prevented, and;

a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors, wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors, and wherein portions of said piezoelectric substrate about comb electrodes and reflector electrodes comprising said plurality of surface acoustic wave elements are provided with auxiliary electrodes electrically independent from each other on said piezoelectric substrate, and wherein a plurality of surface acoustic wave elements and a plurality of sets of auxiliary electrodes are provided on a single piezoelectric substrate.

27. A surface acoustic wave device comprising:

a plurality of surface acoustic wave elements provided on a piezoelectric substrate, wherein electrical connection on said plezoelectric substrate between said plurality of surface acoustic wave elements is prevented, and;

a substrate having a first conductor electrically coupled to one of said surface acoustic wave elements, a plurality of second conductors electrically coupled to another of said surface acoustic wave elements, wherein electrical connection on said substrate between said plurality of second conductors and said first conductor is prevented, and an external terminal electrically connected to at least one of said second conductors, wherein each of said plurality of surface acoustic wave elements are provided with a plurality of bumps, some of said plurality of bumps connecting said plurality of surface acoustic wave elements via said first conductor, and rests of said plurality of bumps connecting said plurality of surface acoustic wave elements and said external terminal via said second conductors, and wherein portions of said plezoelectric substrate about comb electrodes and reflector electrodes comprising said plurality of surface acoustic wave elements are provided with auxiliary electrodes electrically independent from each other on said piezoelectric substrate, and wherein at least one set of auxiliary electrodes comprised of said auxiliary electrodes is surrounding one surface acoustic wave element.

* * * * *

UNITED STATES PATENT AND TRADEMARK OFFICE
CERTIFICATE OF CORRECTION

PATENT NO. : 6,946,929 B2  Page 1 of 1
DATED : September 20, 2005
INVENTOR(S) : Kazuo Ikeda et al.

It is certified that error appears in the above-identified patent and that said Letters Patent is hereby corrected as shown below:

<u>Column 10,</u>
Line 63, after "second" change "conductors" to -- conductor --.

<u>Column 11,</u>
Line 8, change "Includes" to -- includes --.
Line 21, after "second" change "conductors" to -- conductor --.

<u>Column 14,</u>
Line 17, change "plezoelectric" to -- piezoelectric --.

Signed and Sealed this

Sixth Day of June, 2006

JON W. DUDAS
*Director of the United States Patent and Trademark Office*